United States Patent
Cook et al.

(10) Patent No.: US 11,676,930 B2
(45) Date of Patent: Jun. 13, 2023

(54) NANOPARTICLE BACKSIDE DIE ADHESION LAYER

(71) Applicant: Texas Instruments Incorporated, Dallas, TX (US)

(72) Inventors: Benjamin Stassen Cook, Addison, TX (US); Daniel Lee Revier, Dallas, TX (US); Sadia Naseem, Dallas, TX (US); Mahmud Halim Chowdhury, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 141 days.

(21) Appl. No.: 17/315,102

(22) Filed: May 7, 2021

(65) Prior Publication Data
US 2021/0265299 A1 Aug. 26, 2021

Related U.S. Application Data

(62) Division of application No. 15/914,761, filed on Mar. 7, 2018, now Pat. No. 11,031,364.

(51) Int. Cl.
*H01L 23/48* (2006.01)
*H01L 23/00* (2006.01)

(52) U.S. Cl.
CPC .............. *H01L 24/32* (2013.01); *H01L 24/83* (2013.01); *H01L 2224/32058* (2013.01); *H01L 2924/35121* (2013.01)

(58) Field of Classification Search
CPC . H01L 2224/32058; H01L 2924/35121; H01L 24/32; H01L 24/83
See application file for complete search history.

(56) References Cited

U.S. PATENT DOCUMENTS

| | | | |
|---|---|---|---|
| 7,109,591 B2 | 9/2006 | Hack et al. | |
| 7,327,039 B2 | 2/2008 | Charles et al. | |
| 7,368,824 B2 | 5/2008 | Hosseini et al. | |
| 7,476,981 B2* | 1/2009 | Bergmann | H01L 24/83 |
| | | | 257/713 |
| 7,781,260 B2 | 8/2010 | Sane et al. | |
| 7,960,834 B2 | 6/2011 | Funaki | |

(Continued)

FOREIGN PATENT DOCUMENTS

DE 10206818 8/2003

OTHER PUBLICATIONS

Patent Cooperation Treaty Search Report, PCT/US2019/020664, dated Oct. 10, 2019, 2 pages.

*Primary Examiner* — Hoa B Trinh
(74) *Attorney, Agent, or Firm* — Ray A. King; Frank D. Cimino

(57) ABSTRACT

In described examples, a microelectronic device includes a microelectronic die with a die attach surface. The microelectronic device further includes a nanoparticle layer coupled to the die attach surface. The nanoparticle layer may be in direct contact with the die attach surface, or may be coupled to the die attach surface through an intermediate layer, such as an adhesion layer or a contact metal layer. The nanoparticle layer includes nanoparticles having adjacent nanoparticles adhered to each other. The microelectronic die is attached to a package substrate by a die attach material. The die attach material extends into the nanoparticle layer and contacts at least a portion of the nanoparticles.

18 Claims, 10 Drawing Sheets

(56) References Cited

U.S. PATENT DOCUMENTS

| | | | |
|---|---|---|---|
| 8,555,491 B2 | 10/2013 | Boureghda et al. | |
| 8,586,480 B1 * | 11/2013 | Zommer | H01L 23/49513 |
| | | | 438/654 |
| 8,853,006 B2 | 10/2014 | Shimonishi et al. | |
| 8,912,637 B1 | 12/2014 | Zhang | |
| 9,111,782 B2 | 8/2015 | Zommer | |
| 9,397,063 B2 | 7/2016 | Haba | |
| 9,425,161 B2 | 8/2016 | Viswanathan et al. | |
| 9,583,453 B2 | 2/2017 | Shearer et al. | |
| 9,589,860 B2 | 3/2017 | Viswanathan et al. | |
| 11,031,364 B2 * | 6/2021 | Cook | H01L 24/743 |
| 2005/0064183 A1 | 3/2005 | Lunsford et al. | |
| 2005/0072461 A1 | 4/2005 | Kuchinski et al. | |
| 2005/0230042 A1 | 10/2005 | Hashimoto | |
| 2008/0122118 A1 | 5/2008 | Basheer et al. | |
| 2008/0145607 A1 | 6/2008 | Kajiwara et al. | |
| 2008/0169574 A1 | 7/2008 | Molkkari et al. | |
| 2008/0237822 A1 | 10/2008 | Raravikar et al. | |
| 2009/0166852 A1 | 7/2009 | Hu | |
| 2009/0278244 A1 | 11/2009 | Dune et al. | |
| 2012/0106111 A1 | 5/2012 | Mazzochette et al. | |
| 2012/0292009 A1 | 11/2012 | Kohler et al. | |
| 2014/0042624 A1 | 2/2014 | Zommer | |
| 2014/0238485 A1 | 8/2014 | Mizuno et al. | |
| 2015/0041827 A1 | 2/2015 | Iwata et al. | |
| 2016/0240505 A1 | 8/2016 | Tatsumi et al. | |
| 2017/0323844 A1 * | 11/2017 | Karlicek, Jr. | H01L 23/4951 |

\* cited by examiner

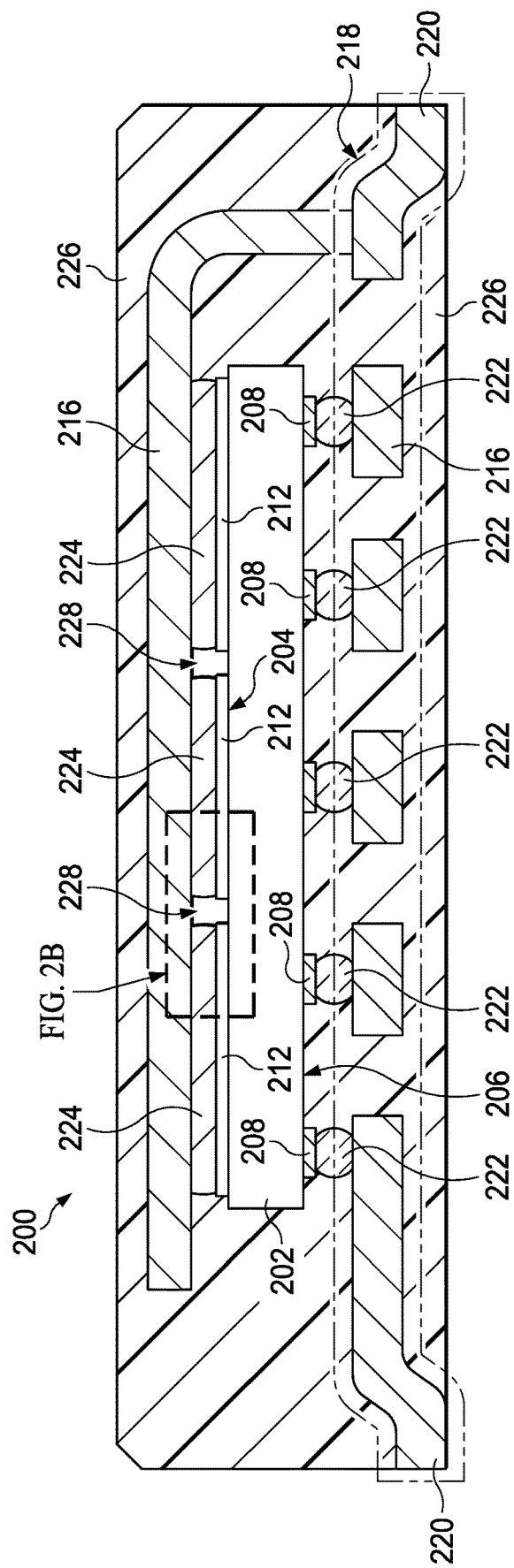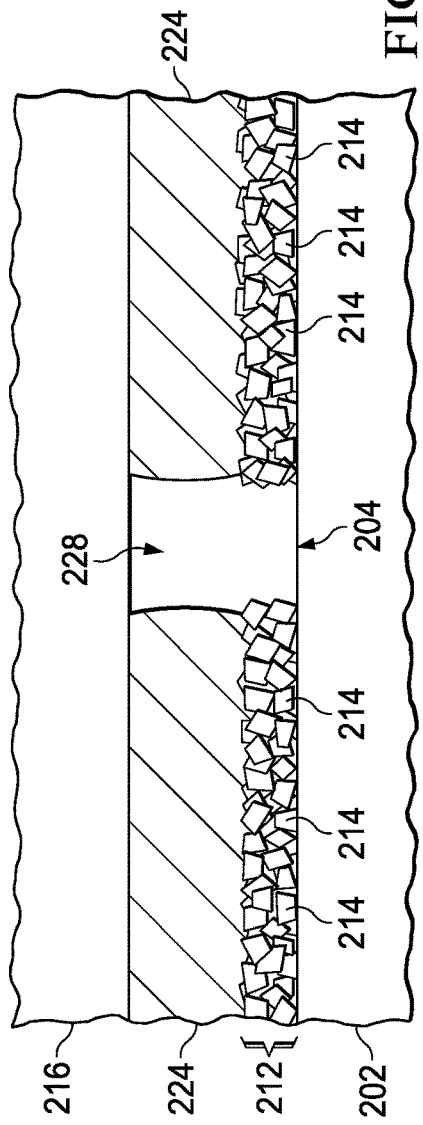
FIG. 2A
FIG. 2B

NANOPARTICLE BACKSIDE DIE ADHESION LAYER

This application is a division of U.S. patent application Ser. No. 15/914,761, filed Mar. 7, 2018, the contents of all of which are herein incorporated by reference in its entirety.

TECHNICAL FIELD

This relates generally to microelectronic devices, and more particularly to adhesion layers for assembly of microelectronic devices.

BACKGROUND

A microelectronic device may include a die that is attached to a package substrate at a die attach surface of the die. The die may be attached to the package substrate by a die attach material, such as an adhesive or solder. The die attach surface may be smooth, as a result of fabrication processes, such as backgrinding, used to make the die. The smoothness of the die attach surface may provide limited mechanical support for adhesion of the die attach material. Stress between die and the package substrate, such as resulting from thermal expansion, may cause the die attach material to separate from the die attach surface, undesirably degrading performance of the microelectronic device.

SUMMARY

In described examples, a microelectronic device includes a microelectronic die with a die attach surface. The microelectronic die is attached to a package substrate of the microelectronic device by a die attach material. The microelectronic device includes a nanoparticle layer coupled to the die attach surface. The nanoparticle layer includes nanoparticles. Adjacent nanoparticles are adhered to each other. The die attach material extends into the nanoparticle layer and contacts at least a portion of the nanoparticles.

BRIEF DESCRIPTION OF THE DRAWINGS

FIG. 2A and FIG. 2B are cross-sections of another example microelectronic device.

DETAILED DESCRIPTION OF EXAMPLE EMBODIMENTS

Figure 1A:
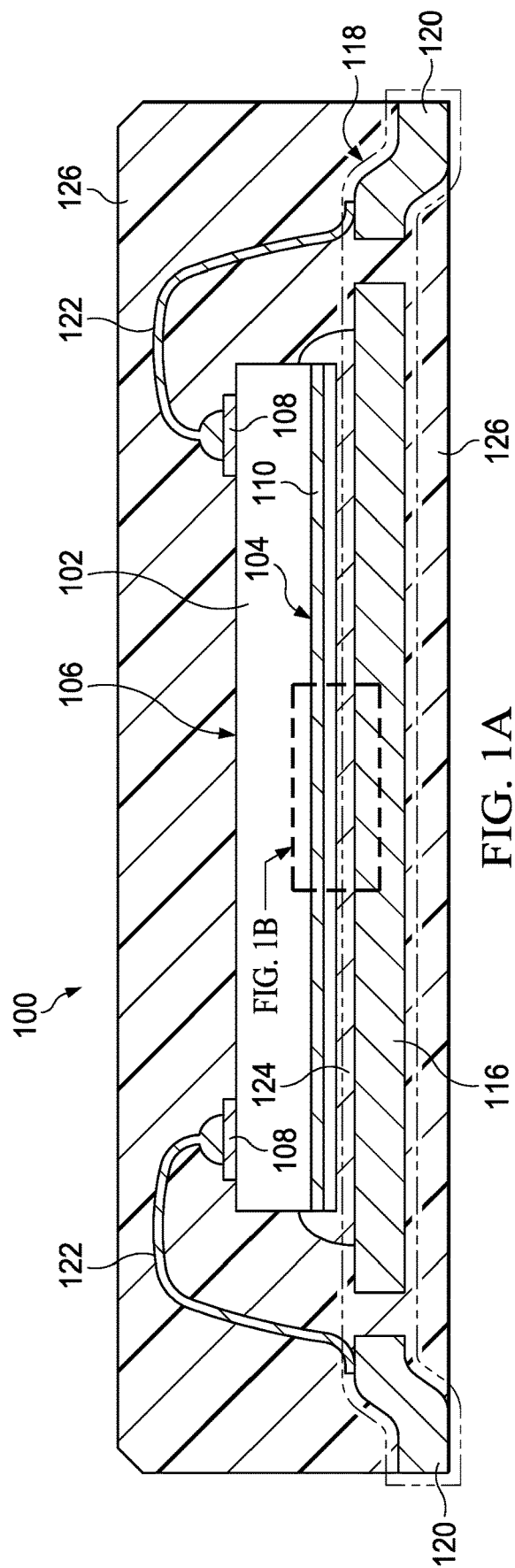
FIG. 1A and FIG. 1B are cross-sections of an example microelectronic device.

The drawings are not necessarily drawn to scale. Example embodiments are not limited by the illustrated ordering of acts or events, as some acts or events may occur in different orders and/or concurrently with other acts or events. Furthermore, not all illustrated acts or events are required to implement a methodology in accordance with example embodiments.

A microelectronic device includes a microelectronic die, such as a silicon integrated circuit, a device having a substrate of a compound semiconductor material (such as silicon carbide, gallium nitride, or gallium arsenide), a microelectronic mechanical system (MEMS) device, an optoelectronic device, or a discrete semiconductor component (such as a power transistor). The microelectronic die has a die attach surface, such as a surface opposite from a component surface, the component surface having bond pads coupled to various components of the microelectronic die. Material of the microelectronic die at the die attach surface may be electrically conductive or semiconducting, such as metal or semiconductor material. Alternatively, the material of the microelectronic die at the die attach surface may be electrically nonconductive or semi-insulating, such as sapphire, glass, undoped gallium nitride, or high purity silicon. The microelectronic device includes a package substrate, such as a die pad of a lead frame, or a die pad of a ceramic chip carrier. The microelectronic die is attached to the package substrate by a die attach material. The die attach material may be electrically conductive, such as solder or adhesive containing electrically conductive particles of metal or carbon. Alternatively, the die attach material may be electrically nonconductive, such as a polymer adhesive free of electrically conductive particles. The microelectronic device includes a nanoparticle layer coupled to the die attach surface. The nanoparticle layer includes nanoparticles. Adjacent nanoparticles are adhered to each other. The nanoparticle layer may be directly coupled to the die attach surface, or may be coupled to the die attach surface through an intermediate layer, such as an adhesion layer or a contact metal layer, having metal, aluminum oxide or similar material. The nanoparticles attach to the intermediate layer (if present) by molecular bonds, such as metallic bonds, covalent bonds, or similar bonds. The die attach material extends into the nanoparticle layer and contacts at least a portion of the nanoparticles. Mechanical adhesion of the die attach material to the die attach surface may be advantageously higher than a comparable microelectronic device with no nanoparticle layer, because the die attach material contacts the nanoparticles in an interlocking configuration. Separation of the die attach surface from the package substrate due to stress may thus be reduced or avoided, and so reliability of the microelectronic device may thus be improved.

For the purposes of this disclosure, if an element is referred to as being "coupled" to another element, it may be directly coupled to the other element, or intervening elements may exist. If an element is referred to as being "directly coupled" to another element, no other intervening elements are intentionally disposed. Similarly, if an element is referred to as being "on" another element, it may be directly on the other element, or intervening elements may exist. If an element is referred to as being "directly on" another element, no other intervening elements are intentionally disposed.

Figure 1B:
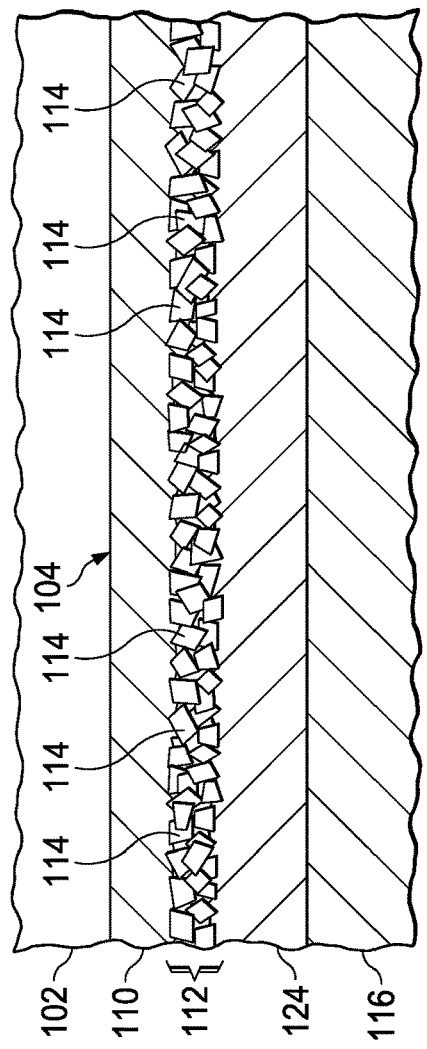

FIG. 1A and FIG. 1B are cross-sections of an example microelectronic device 100. The microelectronic device 100 includes a microelectronic die 102. The microelectronic die 102 has a die attach surface 104. The microelectronic die 102 of this example further has a component surface 106 opposite from the die attach surface 104. Bond pads 108 are located at the component surface 106. The bond pads 108 are electrically coupled to components of the microelectronic die 102. For example, the microelectronic die 102 may be an integrated circuit, a discrete device (such as a power transistor), an optoelectronic device, or a MEMS device. Also for example, material of the microelectronic die 102 extending to the die attach surface 104 may include silicon, gallium nitride, gallium arsenide, silicon carbide, sapphire, or glass.

In this example, the microelectronic device 100 includes an intermediate layer 110 directly contacting the die attach surface 104. For example, the intermediate layer 110 may include one or more metal layers such as a layer stack of titanium, nickel, and silver, which exhibits desired adhesion to silicon surfaces. Metal in the intermediate layer 110 may reduce a sheet resistance of a substrate of the microelectronic die 102, advantageously reducing debiasing of regions of the substrate due to lateral currents in the substrate. The intermediate layer 110 may include one or more dielectric materials (such as aluminum oxide or silicon monoxide), which exhibit desired adhesion to dielectric surfaces. Other materials for the intermediate layer 110 are within the scope of this example.

The microelectronic device 100 includes a nanoparticle layer 112 coupled to the die attach surface 104. In this example, the nanoparticle layer 112 directly contacts the intermediate layer 110, and so is coupled to the die attach surface 104 through the intermediate layer 110. The nanoparticle layer 112 may extend continuously across the die attach surface 104, as depicted in FIG. 1A. The nanoparticle layer 112 includes nanoparticles 114, as depicted in FIG. 1B. Adjacent nanoparticles 114 are adhered to each other. The nanoparticles 114 may include electrically conductive materials (such as metals and graphene), so that the nanoparticle layer 112 is electrically conductive. Some instances of the nanoparticles 114 may have cores of metal (such as copper), surrounded by one or more layers of oxidation-resistant metal (such as nickel, silver or gold). Other instances of the nanoparticles 114 may have cores of dielectric material, such as aluminum oxide or silicon dioxide, surrounded by one or more layers of oxidation-resistant metal. Further instances of the nanoparticles 114 may be electrically nonconductive and may include ceramic materials, such as oxides, carbides, or nitrides. Other compositions and structures of the nanoparticles 114 are within the scope of this example. The nanoparticle layer 112 may include binder material, such as silicon-containing molecules, providing adhesion between the adjacent nanoparticles 114.

The microelectronic device 100 includes a package substrate 116. For example, the package substrate 116 may include metal, ceramic, glass, printed circuit board material such as (fiberglass reinforced plastic), or other material appropriate for supporting the microelectronic die 102. A surface of the package substrate 116 facing the microelectronic die 102 may be electrically conductive, or electrically nonconductive. The package substrate 116 may be part of a lead frame 118, which may include external leads 120. The bond pads 108 may be electrically coupled to the external leads 120 by wire bonds 122, as depicted in FIG. 1A.

The microelectronic die 102 is attached to the package substrate 116 by a die attach material 124. In this example, the die attach material 124 directly contacts the package substrate 116. The die attach material 124 extends into the nanoparticle layer 112 and contacts at least a portion of the nanoparticles 114. Some instances of the die attach material 124 may include an adhesive material, such as epoxy or urethane. Instances of the die attach material 124 which include the adhesive material may also include electrically conductive particles such as silver particles, nickel particles, carbon particles, nickel-coated copper particles, or similar particles, to provide electrical conductivity in the die attach material 124. Other instances of the die attach material 124 may include primarily solder, and so may include mixtures of metals such as zinc, bismuth, tin, indium, or antimony.

In versions of this example, the material of the microelectronic die 102 at the die attach surface 104, the intermediate layer 110 (if present), the nanoparticle layer 112, the die attach material 124, and the package substrate 116 are electrically conductive. Those versions may provide desired electrical coupling of the microelectronic die 102 to the package substrate 116, such as to provide a substrate bias to the microelectronic die 102 during operation of the microelectronic device 100. Alternately, in other versions of this example, any of the material of the microelectronic die 102 at the die attach surface 104, the intermediate layer 110 (if present), the nanoparticle layer 112, the die attach material 124, and the package substrate 116 are electrically nonconductive. Those versions may provide a desired electrical isolation of the microelectronic die 102 at the die attach surface 104.

The microelectronic device 100 may further include one or more package elements, such as an encapsulation material 126 around the microelectronic die 102 and the package substrate 116. Other package elements, such as a metal lid over the microelectronic die 102, are within the scope of this example.

FIG. 2A and FIG. 2B are cross-sections of another example microelectronic device 200. The microelectronic device 200 includes a microelectronic die 202. The microelectronic die 202 has: (a) a die attach surface 204; and (b) a component surface 206 opposite from the die attach surface 204. Bond pads 208 are located at the component surface 206. The microelectronic die 202 may be manifested as any of the devices disclosed in reference to the microelectronic die 102 of FIG. 1A.

In this example, the microelectronic device 200 includes a lead frame 218. The bond pads 208 are electrically coupled to the lead frame 218 by bump bonds 222. The microelectronic device 200 further includes a package substrate 216, which (in this example) is a clip 216 electrically coupled to the lead frame 218.

The microelectronic device 200 includes a nanoparticle layer 212 coupled to the die attach surface 204. In this example, the nanoparticle layer 212 directly contacts the die attach surface 204. The nanoparticle layer 212 includes nanoparticles 214, as depicted in FIG. 2B. Adjacent nanoparticles 214 are adhered to each other. The nanoparticles 214 may have any of the compositions and structures disclosed with regard to the nanoparticles 114 of FIG. 1B. The nanoparticle layer 212 may optionally include binder material.

The microelectronic die 202 is attached to the package substrate 216 by a die attach material 224. In this example, the die attach material 224 directly contacts the package substrate 216. The die attach material 224 extends into the nanoparticle layer 212 and contacts at least a portion of the nanoparticles 214. The die attach material 224 may include any of the materials disclosed with regard to the die attach material 124 of FIG. 1A and FIG. 1B.

The nanoparticle layer 212 may be configured to cover a plurality of areas of the die attach surface 204, with gaps 228 in the nanoparticle layer 212 between the areas, as depicted in FIG. 2A and FIG. 2B. In versions of this example, the nanoparticle layer 212 is electrically conductive, and the different areas of the nanoparticle layer 212 may align with circuits in the microelectronic die 202 to reduce lateral currents in a substrate of the microelectronic die 202, which can cause unwanted debiasing of regions of the substrate. In other versions, the combination of areas of the nanoparticle layer 212 and the gaps 228 between the areas may result from a patterned configuration for the nanoparticle layer 212 that balances adhesion to the die attach material 224 and cost of forming the nanoparticle layer 212.

The microelectronic device 200 may further include one or more package elements, such as an encapsulation material 226 around the microelectronic die 202 and the package substrate 216. Other package elements, such as a metal lid over the microelectronic die 202, are within the scope of this example.

Figure 3A:
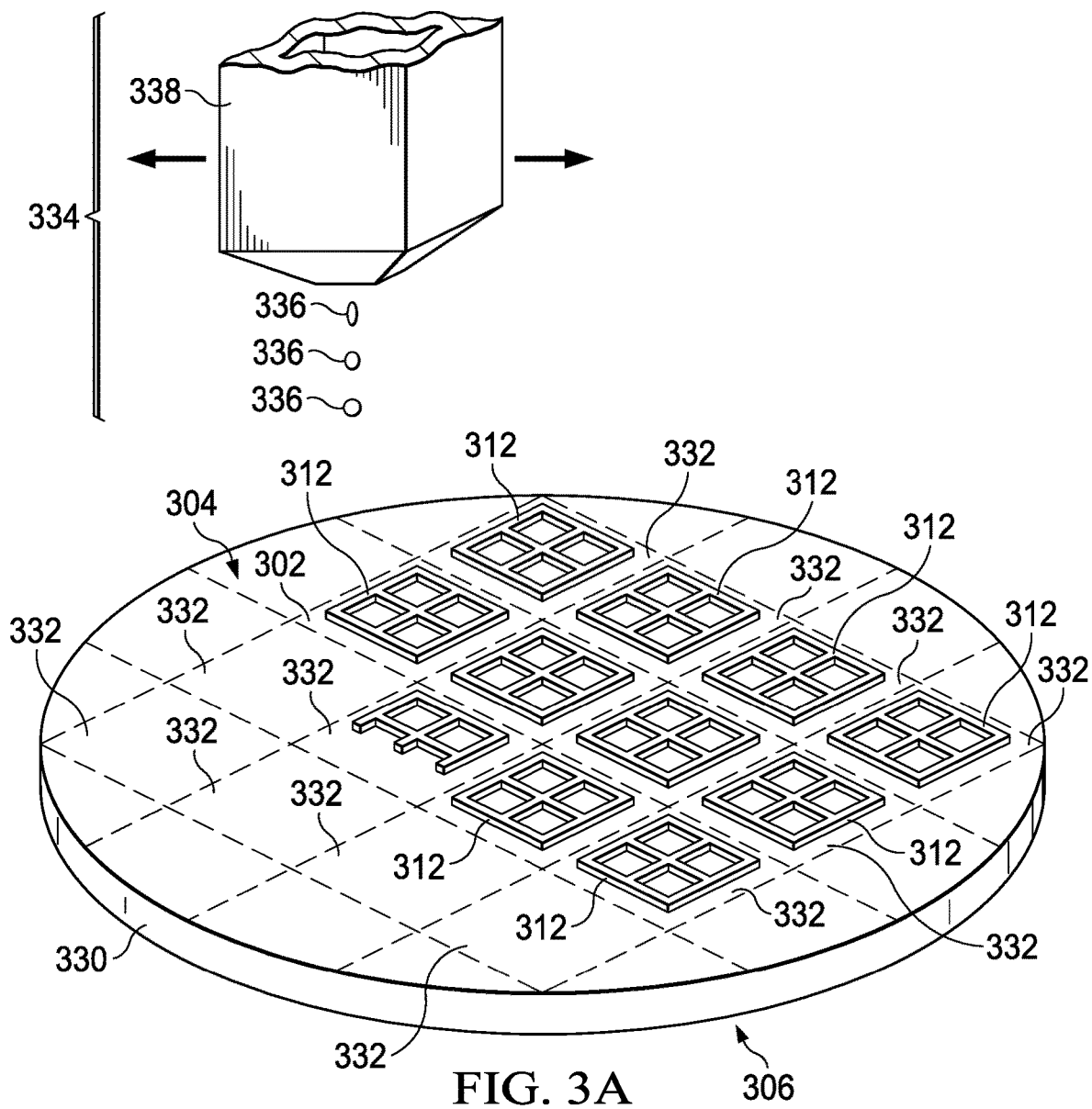
FIG. 3A through FIG. 3E depict a microelectronic device in stages of an example method of formation.

FIG. 3A through FIG. 3E depict a microelectronic device 300 in stages of an example method of formation. Referring to FIG. 3A, a microelectronic substrate 330 includes a microelectronic die 302 of the microelectronic device 300, and may include additional microelectronic die 332. The microelectronic substrate 330 has: (a) a die attach surface 304; and (b) a component surface 306 opposite from the die attach surface 304. The microelectronic die 302 may include components (such as transistors or MEMS components) proximate to the component surface 306. For example, the microelectronic substrate 330 may be a semiconductor wafer (such as a silicon wafer), a silicon-on-insulator (SOI) wafer, a gallium nitride wafer, a gallium arsenide wafer, a sapphire wafer, or other substrate appropriate for forming the microelectronic die 302.

Nanoparticle layers 312 are formed on the die attach surface 304. The nanoparticle layers 312 may be formed directly on the die attach surface 304, as depicted in FIG. 3A, or may be coupled to the die attach surface 304 through an optional intermediate layer (not shown in FIG. 3A). The nanoparticle layers 312 may be patterned, as depicted in FIG. 3A, or may completely cover the die attach surface 304 of the microelectronic die 302 and of the additional microelectronic die 332.

The nanoparticle layers 312 may be formed by an additive process 334 that dispenses a nanoparticle dispersion 336 onto the die attach surface 304. FIG. 3A depicts the additive process 334 partway through forming the nanoparticle layers 312 on each of the microelectronic die 302 and of the additional microelectronic die 332. The nanoparticle dispersion 336 includes nanoparticles, such as having the compositions disclosed with regard to the nanoparticles 114 of FIG. 1B. The nanoparticle dispersion 336 may further include a binder material to improve adhesion between the nanoparticles, or may include a volatile material to improve dispensing properties of the nanoparticle dispersion 336. For example, the additive process 334 may include an inkjet process, represented in FIG. 3A by an inkjet dispense head 338. Examples of other additive processes include binder jetting, directed energy deposition, material extrusion, material jetting, powder bed fusion, sheet lamination, vat photopolymerization, direct laser deposition, electrostatic deposition, laser sintering, electrochemical deposition, and photo-polymerization extrusion. The additive process 334 disposes the nanoparticle dispersion 336 in a desired area for the nanoparticle layers 312 and does not dispose the nanoparticle dispersion 336 outside of the desired area, so that it is not necessary to remove a portion of the dispensed nanoparticle dispersion 336 to produce a final desired shape of the nanoparticle layers 312. The nanoparticle layers 312 have a matrix of nanoparticles, which is efficiently realized by the additive process. Moreover, additive processes may enable forming the nanoparticle layers 312 in desired areas without photolithographic processes and subsequent etch processes, thus advantageously reducing fabrication cost and complexity.

Figure 3B:
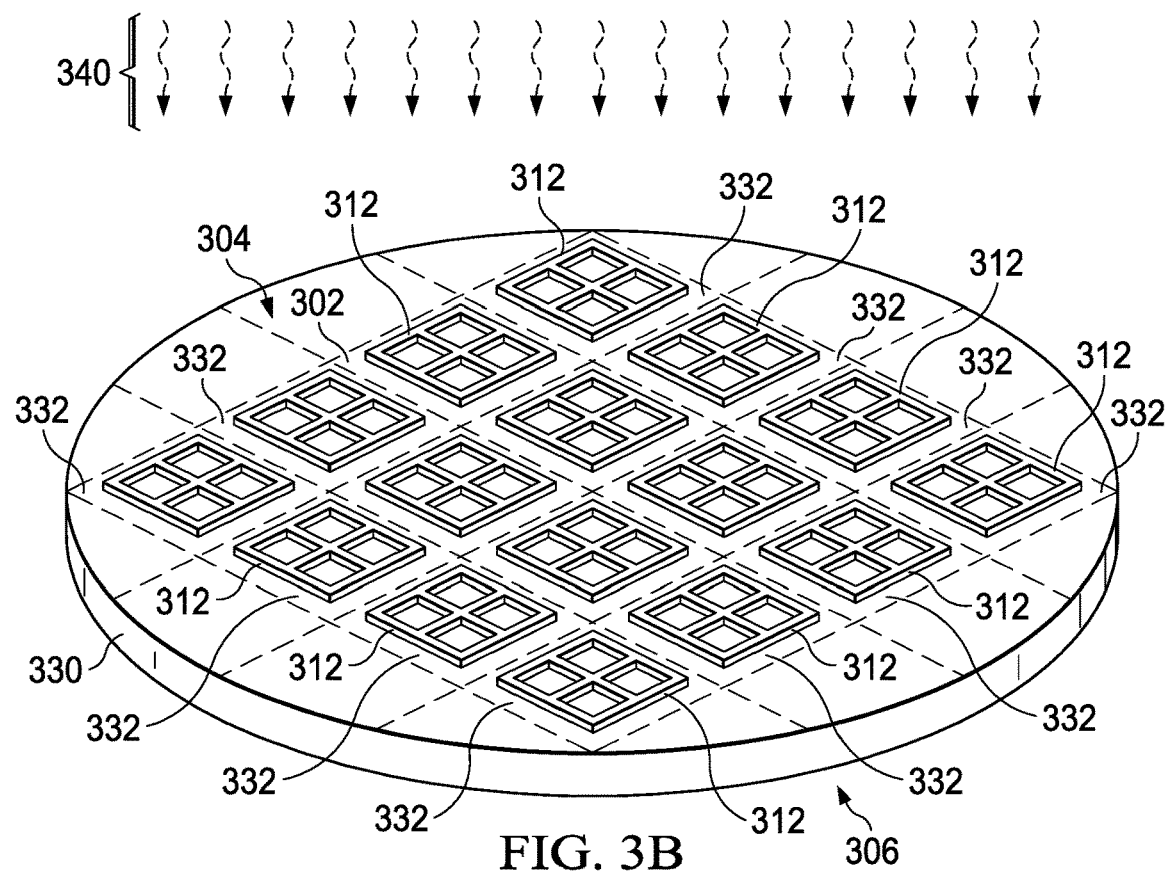

Referring to FIG. 3B, the nanoparticle layers 312 may be heated to remove volatile material from the nanoparticle layers 312, to cure or polymerize binder material in the nanoparticle layers 312, or to form molecular bonds between adjacent nanoparticles in the nanoparticle layers 312, so that adjacent nanoparticles are adhered to each other. The nanoparticle layers 312 may be heated by a radiant heat process 340 as indicated in FIG. 3B, or may be heated by a hotplate process, a furnace process, a xenon flashbulb process, or other heating method. In versions of this example: (a) the nanoparticle layers 312 are patterned; and (b) the nanoparticle layers 312 may be heated by a scanned radiant heating process, such as using light emitting diodes (LEDs), to avoid heating the microelectronic substrate 330 where exposed by the nanoparticle layers 312. This advantageously reduces thermal degradation of components in the microelectronic die 302 and of the additional microelectronic die 332.

Figure 3C:
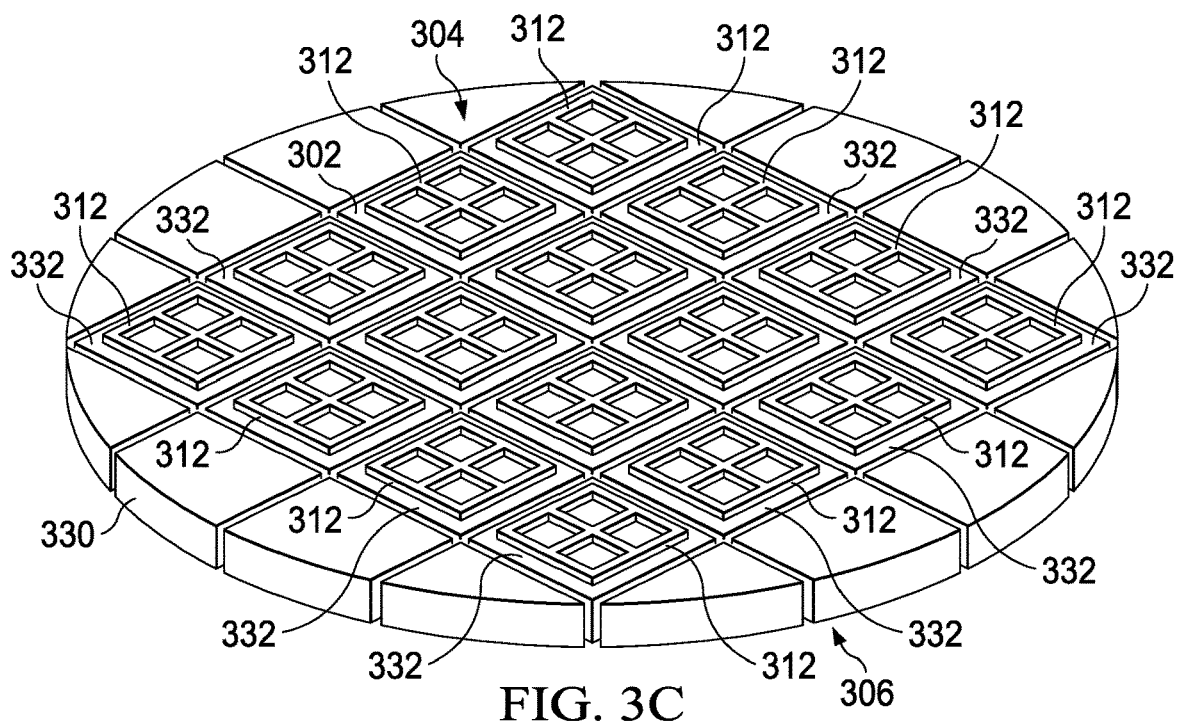

Referring to FIG. 3C, the microelectronic die 302 and the additional microelectronic die 332 are singulated, so they are separated from each other. The microelectronic die 302 and the additional microelectronic die 332 may be singulated by sawing the microelectronic substrate 330, by mechanically scribing the microelectronic substrate 330, by laser scribing the microelectronic substrate 330, by etching the microelectronic substrate 330 between the microelectronic die 302 and the additional microelectronic die 332, or by other singulation process. After the microelectronic die 302 and the additional microelectronic die 332 are singulated, the microelectronic die 302 and the additional microelectronic die 332 may be separated for assembly.

Figure 3D:
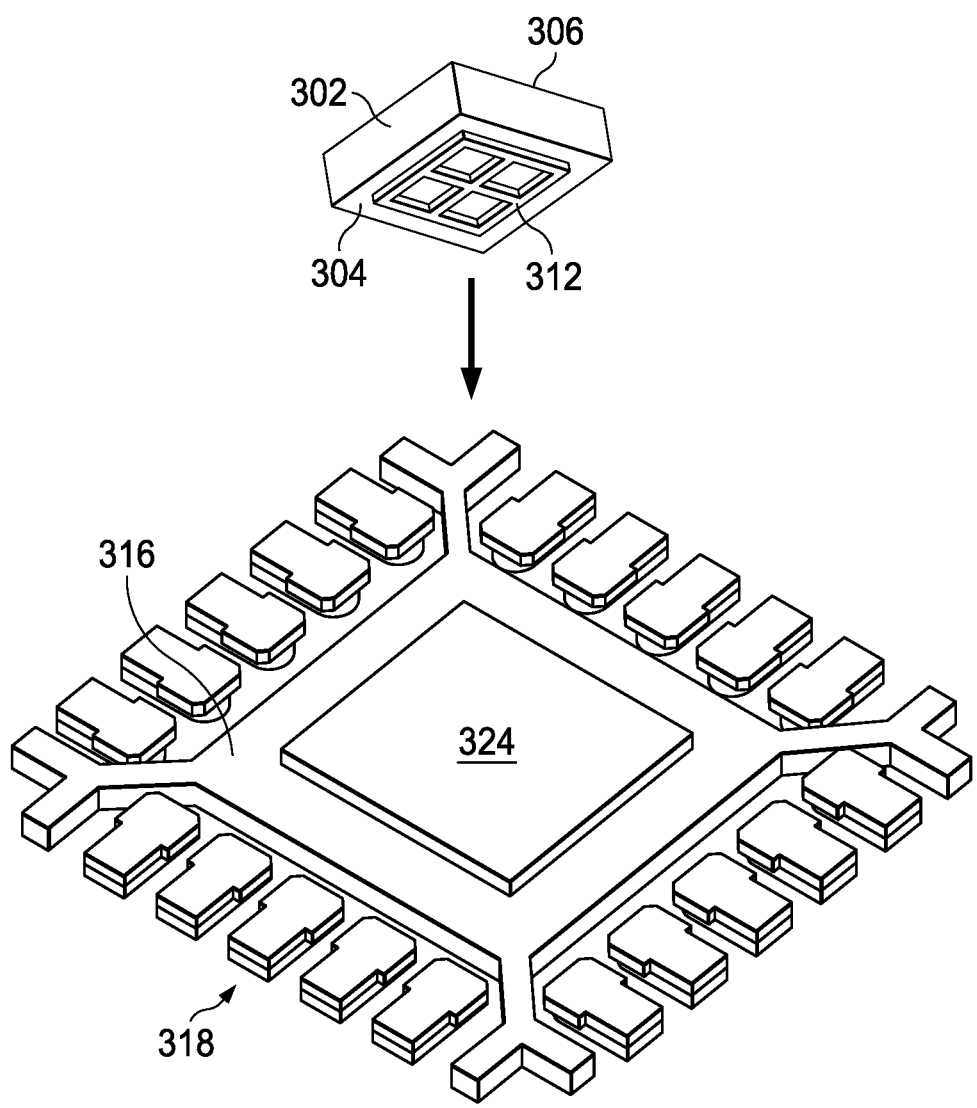

Referring to FIG. 3D, a layer of die attach material 324 is disposed on a package substrate 316 of a lead frame 318. The package substrate 316 may be a die attach area of the lead frame 318. The layer of die attach material 324 may be a solder preform, or other die attach material. The lead frame 318 may be a portion of a lead frame array, connected to other lead frames by tie bars.

The microelectronic die 302 is disposed on the layer of die attach material 324 so that the nanoparticle layer 312 directly contacts the layer of die attach material 324. The microelectronic die 302 may be disposed on the layer of die attach material 324, such as by a pick and place operation.

Figure 3E:
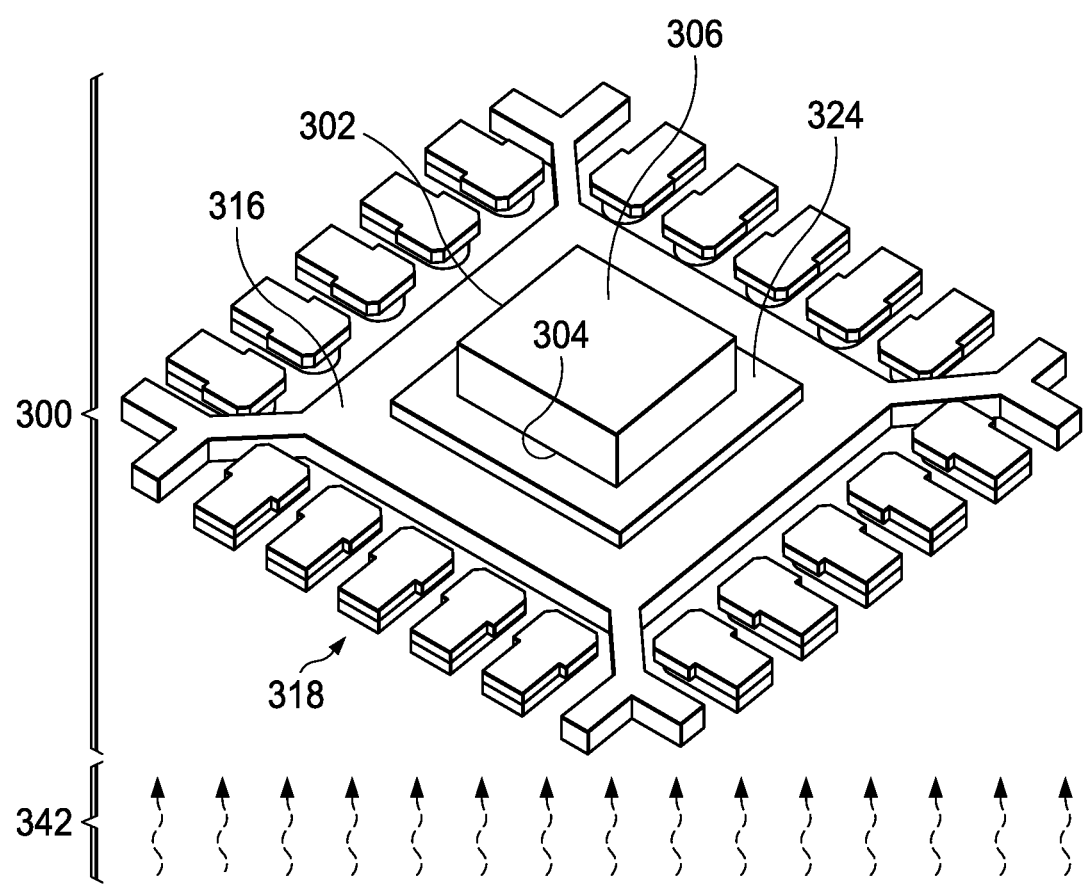

Referring to FIG. 3E, the lead frame 318, the die attach material 324, the nanoparticle layer 312, which is hidden in FIG. 3E, and the microelectronic die 302 are heated, causing the die attach material 324 to attach to the package substrate 316 and to extend into, and attach to, the nanoparticle layer 312. In versions of this example, the die attach material 324 is manifested as solder, and heating the die attach material 324 causes the solder to reflow and harden upon subsequent cooling. In other versions, the die attach material 324 is manifested as a thermosetting adhesive, and heating the die attach material 324 causes the adhesive to cure or set. In some versions, the die attach material 324 is manifested as a thermoplastic adhesive, and heating the die attach material 324 causes the adhesive to have a lower viscosity and flow into the nanoparticle layer, and become more viscous upon subsequent cooling. The lead frame 318, the die attach material 324, the nanoparticle layer 312, and the microelectronic die 302 may be heated by a radiant heat process 342, as depicted in FIG. 3E, or by another heating process such as a hot plate process, a furnace process, or similar process.

The microelectronic device 300, which includes the microelectronic die 302 attached to the package substrate 316 by the die attach material 324 through the nanoparticle layer 312, may be further formed by adding package elements (e.g., encapsulation material or mechanical package elements such as a lid). Other methods of further forming the microelectronic device 300 are within the scope of this example, and other package elements of the microelectronic device 300 are within the scope of this example.

Figure 4A:
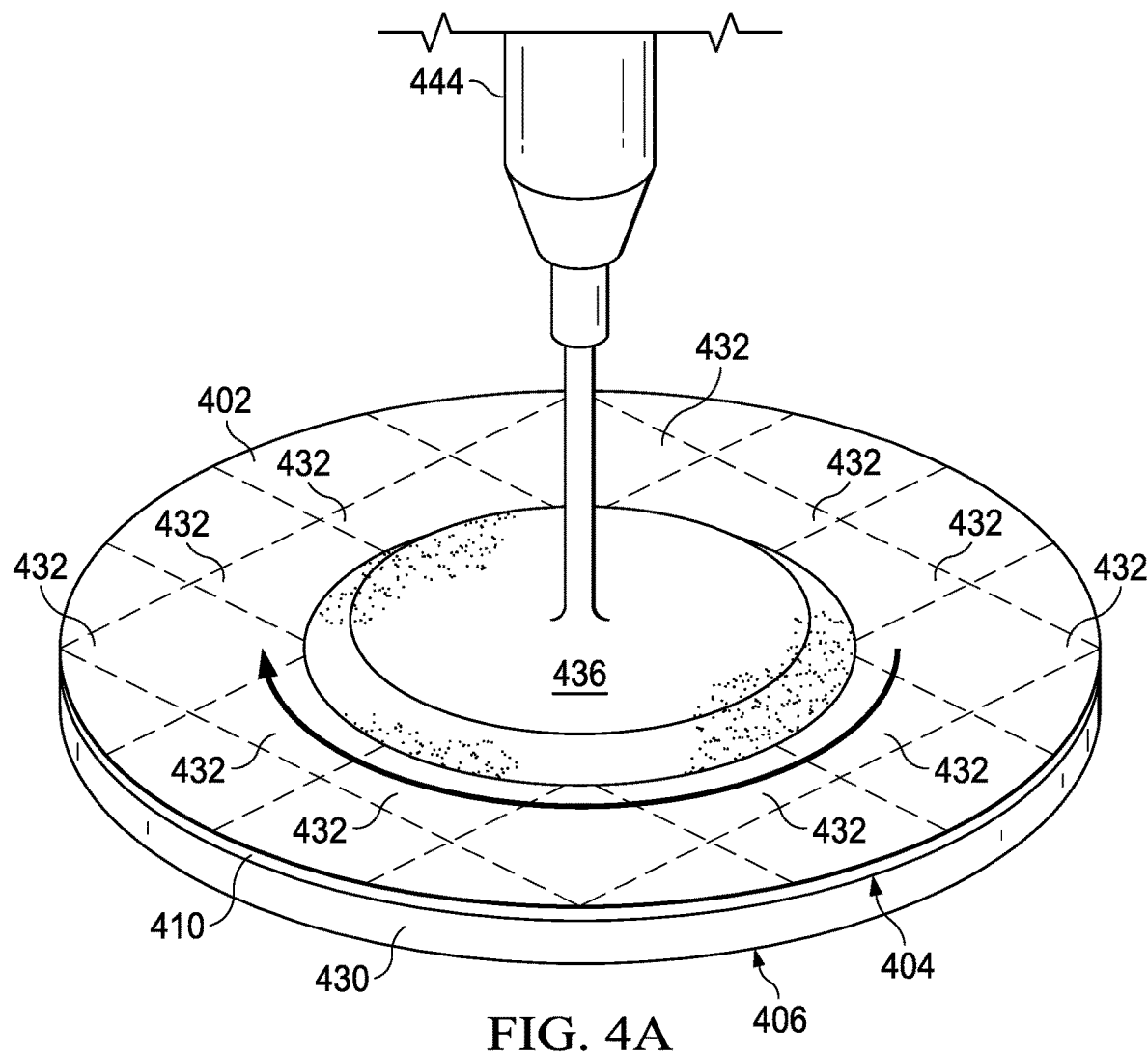
FIG. 4A through FIG. 4E depict a microelectronic device in stages of another example method of formation.

FIG. 4A through FIG. 4E depict a microelectronic device 400 in stages of another example method of formation. Referring to FIG. 4A, a microelectronic substrate 430 includes a microelectronic die 402 of the microelectronic device 400, and additional microelectronic die 432. The microelectronic substrate 430 has: (a) a die attach surface 404 and (b) a component surface 406 opposite from the die attach surface 404. The microelectronic die 402 may include components proximate to the component surface 406.

In this example, an intermediate layer 410 is formed on the die attach surface 404. The intermediate layer 410 may have a composition and electrical conductivity as disclosed with regard to the intermediate layer 110 of FIG. 1A and FIG. 1B. The intermediate layer 410 may be formed by the same facility that formed the components in the microelectronic die 402 and additional microelectronic die 432, or may be formed in a separate facility, such as an assembly facility that will assemble the microelectronic die 402 into the subsequently formed microelectronic device 400.

Nanoparticle dispersion 436 is dispensed onto the intermediate layer 410, such as by a spin-coat apparatus 444 as depicted in FIG. 4A. The nanoparticle dispersion 436 includes nanoparticles, not shown in FIG. 4A, along with one or more fluid components, such as solvent, binder monomer, or adhesion promoter. The microelectronic substrate 430 is spun by the spin-coat apparatus 444 to spread the nanoparticle dispersion 436 across the intermediate layer 410.

Figure 4B:
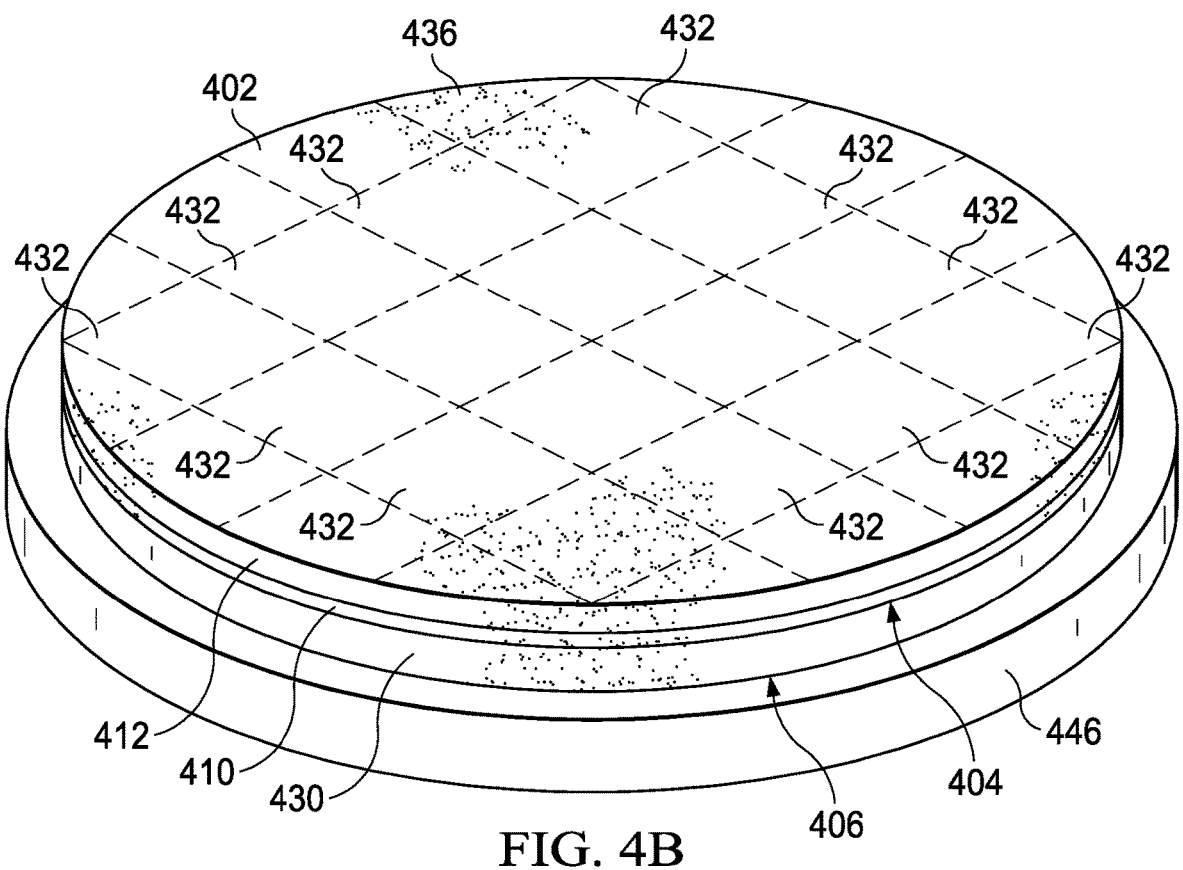

Referring to FIG. 4B, the microelectronic substrate 430 is heated to remove volatile material from the nanoparticle dispersion 436 of FIG. 4A and convert the nanoparticle dispersion 436 on the intermediate layer 410 to a nanoparticle layer 412 in which adjacent nanoparticles are adhered to each other. The microelectronic substrate 430 may be heated by a hot plate process using a heated chuck 446, as depicted in FIG. 4B. Other methods for heating the microelectronic substrate 430 are within the scope of this example.

Figure 4C:
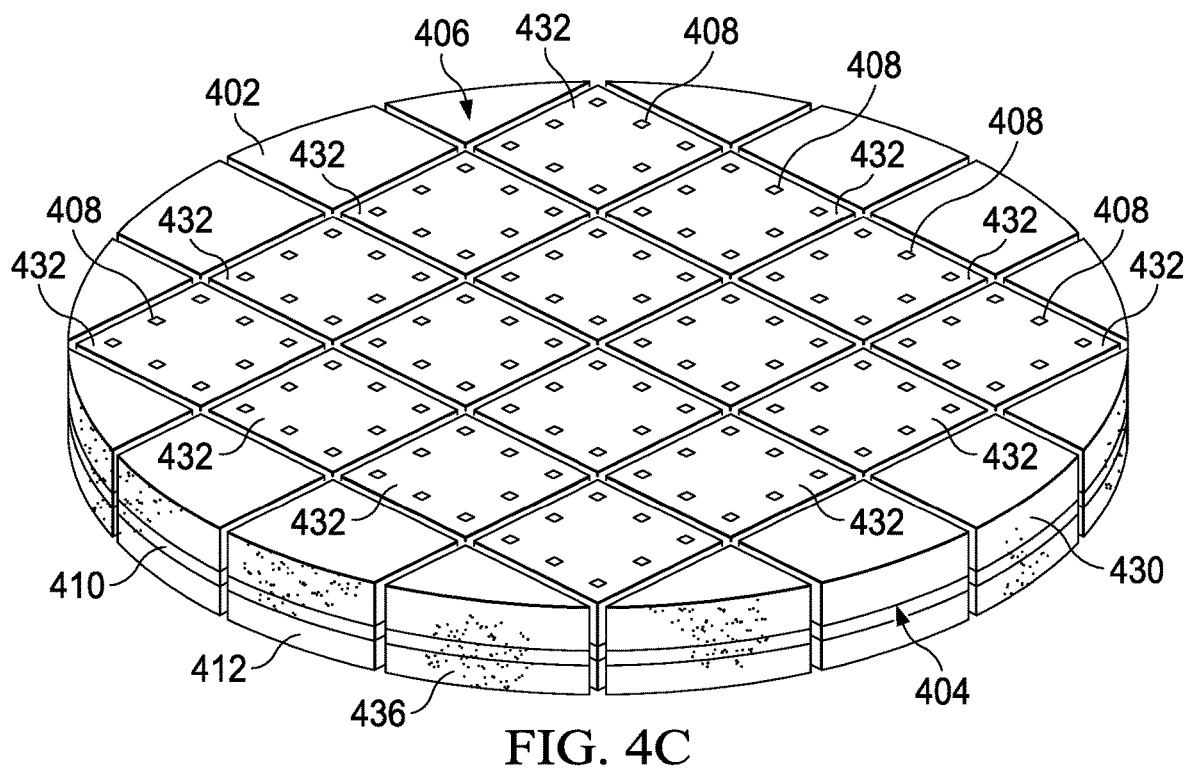

Referring to FIG. 4C, the microelectronic die 402 and the additional microelectronic die 432 are singulated. In FIG. 4C, the stack of the microelectronic substrate 430, the intermediate layer 410, and the nanoparticle layer 412 are inverted with respect to FIG. 4B, to show the component surface 406. Each of the microelectronic die 402 and the additional microelectronic die 432 may have bond pads 408 proximate to the component surface 406.

Figure 4D:
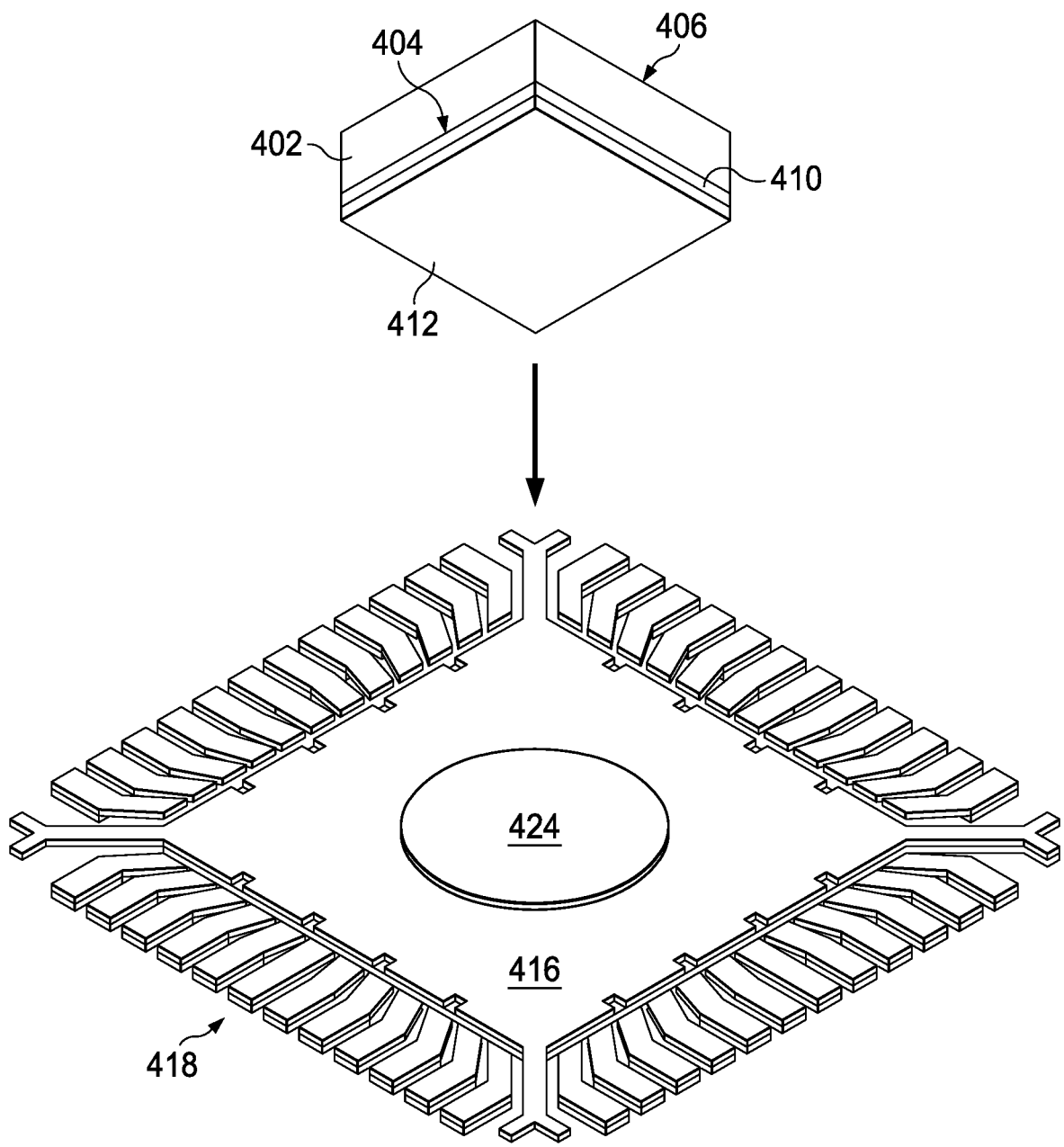

Referring to FIG. 4D, a layer of die attach material 424 is disposed on a package substrate 416 of a lead frame 418. The package substrate 416 may be a die attach area of the lead frame 418. The layer of die attach material 424 may be a portion of adhesive 424, as depicted in FIG. 4D, or other die attach material. The microelectronic die 402 is disposed on the layer of die attach material 424 so that the nanoparticle layer 412 directly contacts the layer of die attach material 424.

Figure 4E:
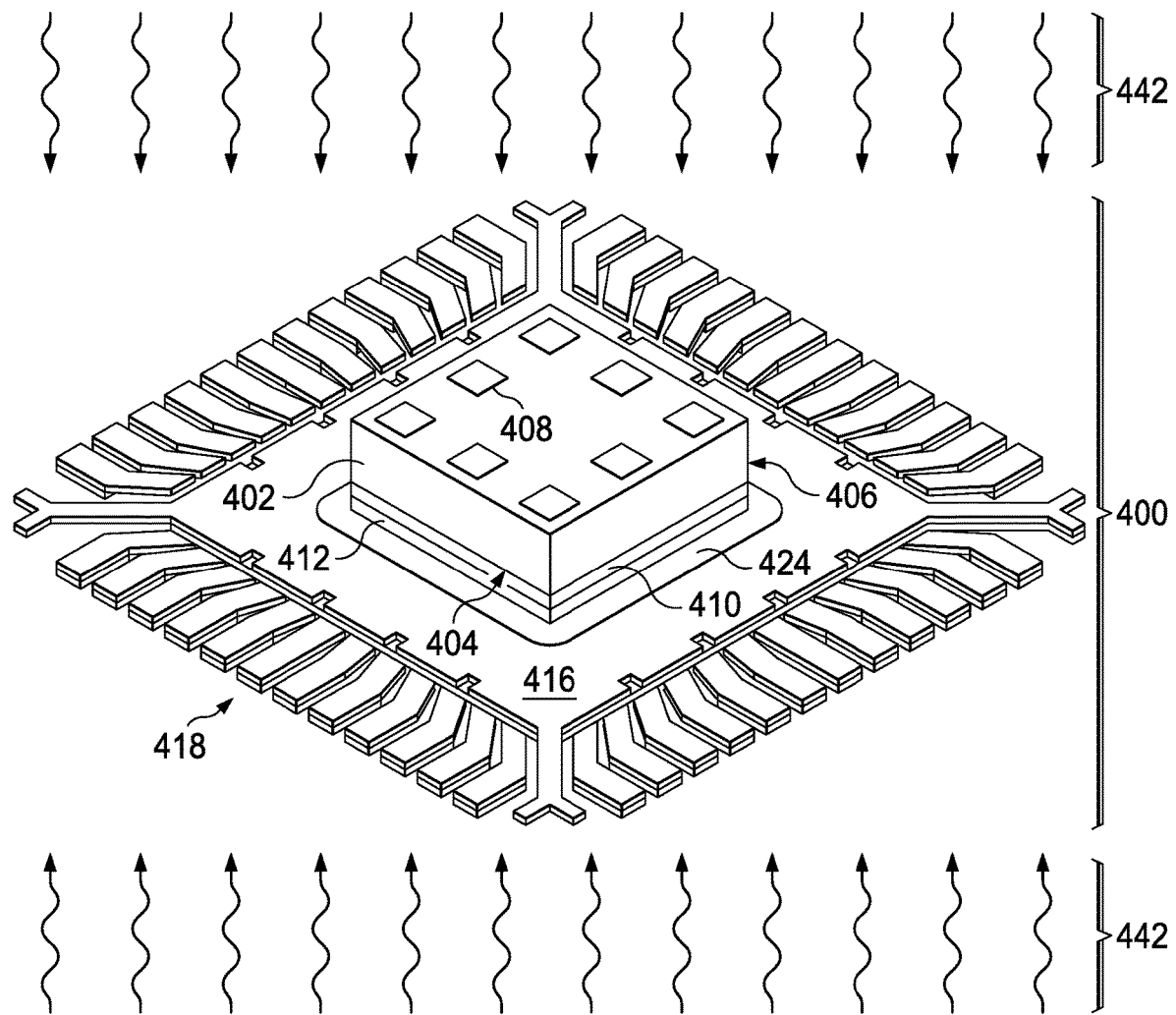

Referring to FIG. 4E, the lead frame 418, the die attach material 424, the intermediate layer 410, the nanoparticle layer 412, and the microelectronic die 402 are heated, causing the die attach material 424 to attach to the package substrate 416 and to extend into, and attach to, the nanoparticle layer 412. In versions of this example, the die attach material 424 is manifested as a thermosetting adhesive, and heating the die attach material 424 causes the adhesive to cure or set. In some versions, the die attach material 424 is manifested as a thermoplastic adhesive, heating the die attach material 424 causes the adhesive to have a lower viscosity and flow into the nanoparticle layer and become more viscous upon subsequent cooling. In other versions, the die attach material 424 is manifested as solder, heating the die attach material 424 causes the solder to reflow and harden upon subsequent cooling. The lead frame 418, the die attach material 424, the nanoparticle layer 412, and the microelectronic die 402 may be heated by a radiant heat process 442 applied above and below the microelectronic device 400, as depicted in FIG. 4E, or by another heating process.

The microelectronic device 400, which includes the microelectronic die 402 attached to the package substrate 416 by the die attach material 424 through the nanoparticle layer 412 and the intermediate layer 410, may be further formed by adding package elements (e.g., encapsulation material or mechanical package elements, such as a lid). Other methods of further forming the microelectronic device 400 are within the scope of this example, and other package elements of the microelectronic device 400 are within the scope of this example.

Modifications are possible in the described embodiments, and other embodiments are possible, within the scope of the claims. Various features of the examples disclosed herein may be combined in other manifestations of example microelectronic devices. For example, features disclosed in reference to FIG. 1A and FIG. 1B may be combined with the structure of FIG. 2A and FIG. 2B, and vice versa. Similarly, processes disclosed in reference to FIG. 3A through FIG. 3E may be used in the method disclosed in reference to FIG. 4A through FIG. 4E, and vice versa.

What is claimed is:

1. A method of forming a microelectronic device, the method comprising:
    providing a microelectronic substrate having a die attach surface; and
    forming a nanoparticle layer coupled to and covering a plurality of areas of the die attach surface, the nanoparticle layer including nanoparticles, wherein adjacent nanoparticles are adhered to each other;
    providing a package substrate having a substrate interface surface coupled to the nanoparticle layer; and
    forming a layer of die attach material connecting the nanoparticle layer to the package substrate at the substrate interface surface, wherein the die attach material extends into the nanoparticle layer and contacts at least a portion of the nanoparticles in an interlocking configuration, and wherein a gap extends through the nanoparticle layer and the die attach material, the gap extending from the die attach surface to the substrate interface surface.

2. The method of claim 1, further comprising singulating microelectronic die after forming the nanoparticle layer.

3. The method of claim 1, further comprising forming an intermediate layer on the die attach surface, wherein the nanoparticle layer is formed on the intermediate layer to contact the die attach surface and to contact at least a portion of the nanoparticles.

4. The method of claim 1, wherein forming the nanoparticle layer includes dispensing nanoparticle dispersion in a pattern on the die attach surface.

5. The method of claim 1, wherein at least a portion of the nanoparticles are electrically conductive.

6. The method of claim 1, wherein the nanoparticles are electrically insulating.

7. The method of claim 1, wherein forming the nanoparticle layer includes removing volatile material from the nanoparticle layer by heating the nanoparticle layer.

8. The method of claim 1, wherein forming the nanoparticle layer includes adhering the adjacent nanoparticles by heating the nanoparticle layer.

9. A method of forming a microelectronic device, the method comprising:

providing a microelectronic substrate including a microelectronic die with at least one microelectronic component, the microelectronic substrate having a die attach surface;

providing a nanoparticle layer coupled to the die attach surface, the nanoparticle layer including nanoparticles, wherein adjacent nanoparticles are adhered to each other;

providing a package substrate having a substrate interface surface coupled to the nanoparticle layer; and forming a layer of a die attach material that connects the nanoparticle layer to the package substrate, wherein the die attach material extends into the nanoparticle layer and contacts at least a portion of the nanoparticles in an interlocking configuration, and configured to increase a mechanical adhesion between the die attach surface and the package substrate, wherein a gap extends through the nanoparticle layer and the die attach material, the gap extending from the die attach surface to the substrate interface surface.

10. The method of claim 9, wherein the die attach material includes an adhesive material.

11. The method of claim 9, wherein the die attach material includes solder.

12. The method of claim 9, wherein forming the layer of the die attach material includes heating the die attach material after the die attach material is in contact with the nanoparticle layer.

13. A microelectronic device, comprising:
a microelectronic die having a die attach surface;
a nanoparticle layer coupled to and covering areas of the die attach surface, the nanoparticle layer including nanoparticles, wherein adjacent nanoparticles are adhered to each other;
a package substrate having a substrate interface surface coupled to the nanoparticle layer; and
a layer of a die attach material connecting the nanoparticle layer to the package substrate, wherein the die attach material extends into the nanoparticle layer and contacts at least a portion of the nanoparticles; and
a gap in and extending through the nanoparticle layer and the die attach material layer, the gap extending from the die attach surface to the substrate interface surface, and wherein a gap extends through the nanoparticle layer and the die attach material layer, the gap extending from the die attach surface to the substrate interface surface.

14. The microelectronic device of claim 13, further comprising a metal layer between the die attach surface and the nanoparticle layer, wherein the metal layer contacts the die attach surface and contacts at least a portion of the nanoparticles.

15. The microelectronic device of claim 13, wherein at least a portion of the nanoparticles are electrically conductive.

16. The microelectronic device of claim 13, wherein at least a portion of the nanoparticles are electrically insulating.

17. The microelectronic device of claim 13, wherein the die attach material includes an adhesive material.

18. The microelectronic device of claim 13, wherein the die attach material includes solder.

* * * * *